United States Patent
Hattori et al.

(10) Patent No.: US 6,824,424 B2
(45) Date of Patent: Nov. 30, 2004

(54) CONNECTOR AND FIXING STRUCTURE OF CONNECTOR AND BOARD

(75) Inventors: Tetsuya Hattori, Aichi (JP); Shigeru Hayashi, Aichi (JP); Keiichi Itou, Toyota (JP); Atsushi Nishida, Aichi-ken (JP)

(73) Assignee: Kabushiki Kaisha Tokai Rika Denki Seisakusho, Aichi (JP)

( * ) Notice: Subject to any disclaimer, the term of this patent is extended or adjusted under 35 U.S.C. 154(b) by 0 days.

(21) Appl. No.: 10/379,867

(22) Filed: Mar. 5, 2003

(65) Prior Publication Data

US 2003/0181097 A1 Sep. 25, 2003

(30) Foreign Application Priority Data

Mar. 6, 2002 (JP) ........................................ 2002-060500

(51) Int. Cl.[7] .............................................. H01R 13/60
(52) U.S. Cl. ............................................................ 439/567
(58) Field of Search ................................ 439/567, 571, 439/572, 573

(56) References Cited

U.S. PATENT DOCUMENTS

| 4,588,854 | A | * | 5/1986 | Bailey et al. | 174/52.1 |
|---|---|---|---|---|---|
| 4,753,601 | A | * | 6/1988 | Cobaugh et al. | 436/62 |
| 5,117,330 | A | * | 5/1992 | Miazga | 361/760 |
| 5,244,413 | A | * | 9/1993 | Clark | 439/567 |
| 5,302,134 | A | * | 4/1994 | Thomas et al. | 439/247 |
| 5,312,264 | A | * | 5/1994 | Thomas et al. | 439/247 |
| 5,334,049 | A | * | 8/1994 | Kachlic et al. | 439/567 |
| 5,520,551 | A | * | 5/1996 | Broschard, III | 439/567 |
| 5,563,770 | A | * | 10/1996 | Bethurum | 361/737 |
| 5,796,593 | A | * | 8/1998 | Mills et al. | 361/801 |
| 5,899,771 | A | * | 5/1999 | Clark et al. | 439/567 |
| 6,027,371 | A | * | 2/2000 | Lin et al. | 439/567 |
| 6,068,502 | A | * | 5/2000 | Kuo | 439/353 |
| 6,083,043 | A | * | 7/2000 | Lok | 439/567 |
| 6,109,961 | A | * | 8/2000 | Chen et al. | 439/567 |
| 6,123,580 | A | * | 9/2000 | Bendorf et al. | 439/567 |
| 6,168,463 | B1 | * | 1/2001 | Wu | 439/567 |
| 6,371,802 | B1 | * | 4/2002 | Smalley et al. | 439/567 |
| 2002/0193002 | A1 | * | 12/2002 | Chen | 439/554 |

* cited by examiner

*Primary Examiner*—Ross Gushi
(74) *Attorney, Agent, or Firm*—Crompton, Seager & Tufte, LLC

(57) ABSTRACT

A connector includes a connector body and bases formed on the lower surface of the connector body. When the connector is fixed to a printed board, a part of each base or the lower surface of the connector body contacts the surface of the printed board in accordance with the thickness of the board. Therefore, the connector can be fixed to any one of printed boards having different thicknesses with common fixing pins.

12 Claims, 8 Drawing Sheets

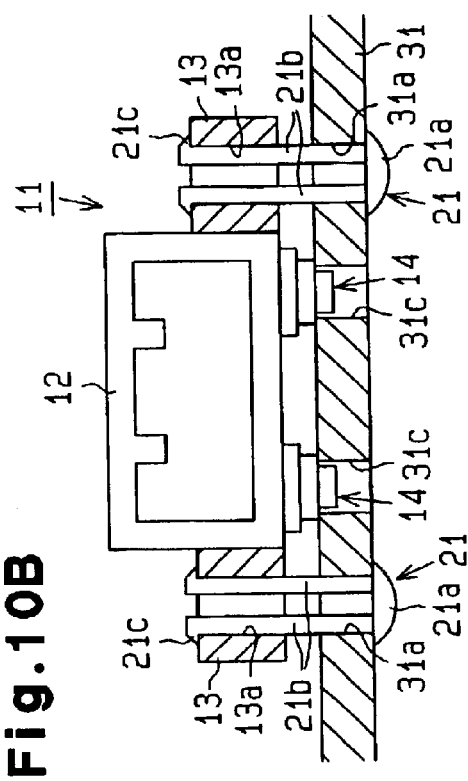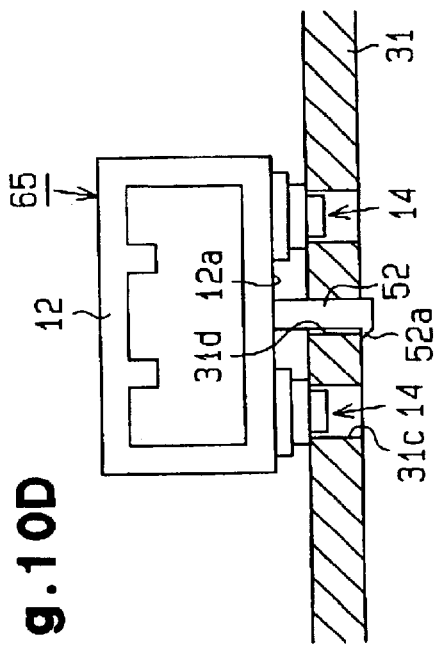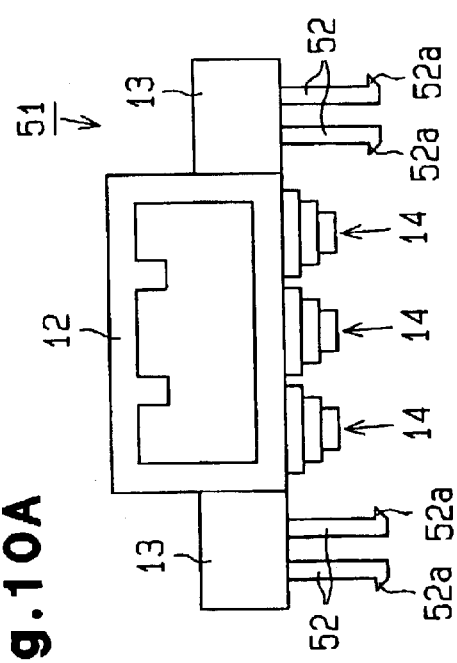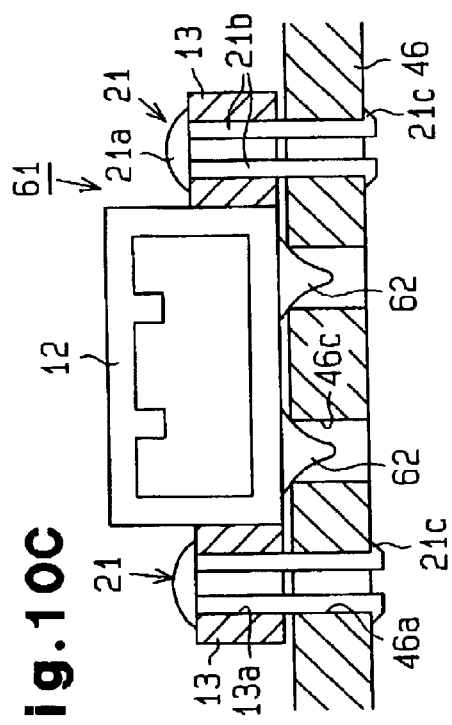

CONNECTOR AND FIXING STRUCTURE OF CONNECTOR AND BOARD

BACKGROUND OF THE INVENTION

The present invention relates to a connector fixed to a board, and particularly to a structure for fixing a connector to a board.

When a connector is fixed to a board, screws or pins are used as fasteners. Today, pins are used predominantly as fasteners. This is because using pins reduces time required for fixing a connector to a board compared to a case where screws are used.

FIG. 13 illustrates a prior art connector 101 fixed to a printed board 104. The connector 101 is made of synthetic resin and has a pair of brackets 102. A through hole 102a is formed in each bracket 102. When fixing the connector 101 to the printed board 104, metal pins 103 are used. The pins 103 each have a head 103a, a pair of elastic axial portions 103b extending from the head 103a, and stopper claws 103c at the distal ends of the axial portions 103b.

Each pin 103 is inserted into the through hole 102a of one of the brackets 102 and into one of a pair of through holes 104a formed in the printed board 104. The head 103a of the inserted pin 103 engages with a part of the top surface of the bracket 102 about the through hole 102a. The stopper claws 103c are engaged with a part of the bottom surface of the printed board 104 about the through hole 104a. This fixes the connector 101 to the printed board 104 and prevents the connector 101 from being loosely held in a direction perpendicular to the printed board 104.

When a connector 101 is fixed to a printed board that has a different thickness from that of the printed board 104, pins having a different length of the axial portions 103b are used. If the connector 101 is fixed to a printed board that is thinner than the printed board 104 with the pins 103, there will be a gap between the stopper claws 103c of each pin 103 and a part of the bottom surface of the printed board about the through hole 104a, and the connector 101 will be loosely held in a direction perpendicular to the printed board. Also, if the connector 101 is fixed to a printed board that is thicker than the printed board 104, the pins 103 are too short to be used to fix the connector 101.

SUMMARY OF THE INVENTION

Accordingly, it is an objective of the present invention to provide a structure for fixing a connector to a board which structure permits a connector to be stably fixed to boards having different thicknesses with common fasteners.

To achieve the foregoing and other objectives and in accordance with the purpose of the present invention, a fixing structure of a connector and a board is provided. The fixing structure includes a fastener for fixing the connector to the board, and a space maintaining mechanism located between the connector and the board. The fastener extends from a first member to a second member. The first member is one of the connector and the board, and the second member is the other one of the connector and the board. The fastener includes a engaging portion that is engaged with the second member. When the engaging portion is engaged with the second member, a predetermined space is created between a facing side of the connector and a facing side of the board. The facing sides face each other. The space is varied in accordance with the thickness of the board. The space maintaining mechanism determines the position of the connector relative to the board such that the space in accordance with the thickness of the board is maintained.

In another aspect of the present invention, a connector fixed to a board with a fastener is provided. The fastener extends from a first member to a second member. The first member is one of the connector and the board, and the second member is the other one of the connector and the board. The fastener includes a engaging portion that is engaged with the second member. When the engaging portion is engaged with the second member, a predetermined space is created between a facing side of the connector and a facing side of the board. The facing sides face each other. The space is varied in accordance with the thickness of the board. A projection is formed on the facing side of the connector. The cross-sectional area of the projection decreases as the distance from the facing side of the connector increases. The projection determines the position of the connector relative to the board such that the space in accordance with the thickness of the board is maintained.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which:

FIG. 10A is a front view illustrating a connector according to another embodiment;

FIG. 10B is a front view, with a part cut away, illustrating a connector according to another embodiment fixed to the first printed board;

FIG. 10C is a front view, with a part cut away, illustrating a connector according to another embodiment fixed to the sixth printed board;

FIG. 10D is a front view, with a part cut away, illustrating a connector according to another embodiment fixed to the first printed board;

DETAILED DESCRIPTION OF THE PREFERRED EMBODIMENTS

A first embodiment of the present invention will now be described with reference to FIGS. 1 to 5.

Figure 1:
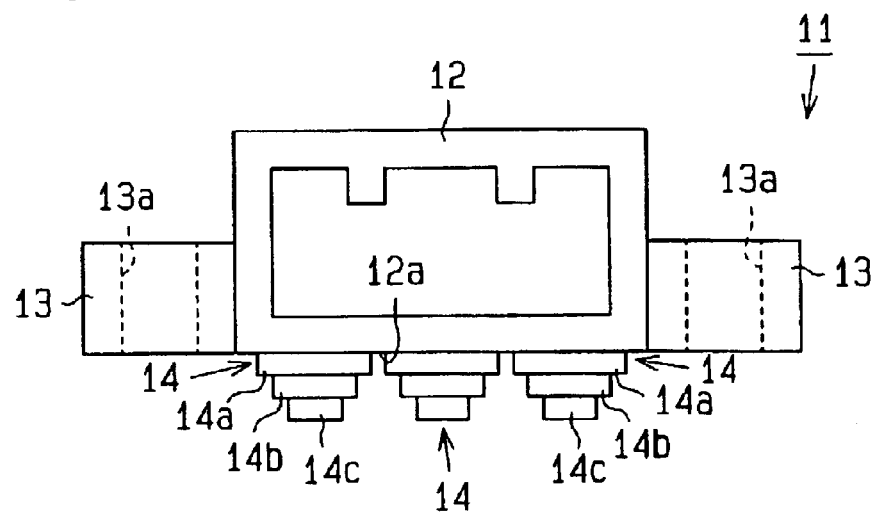
FIG. 1 is a front view illustrating a connector according to a first embodiment of the present invention.
Figure 2:
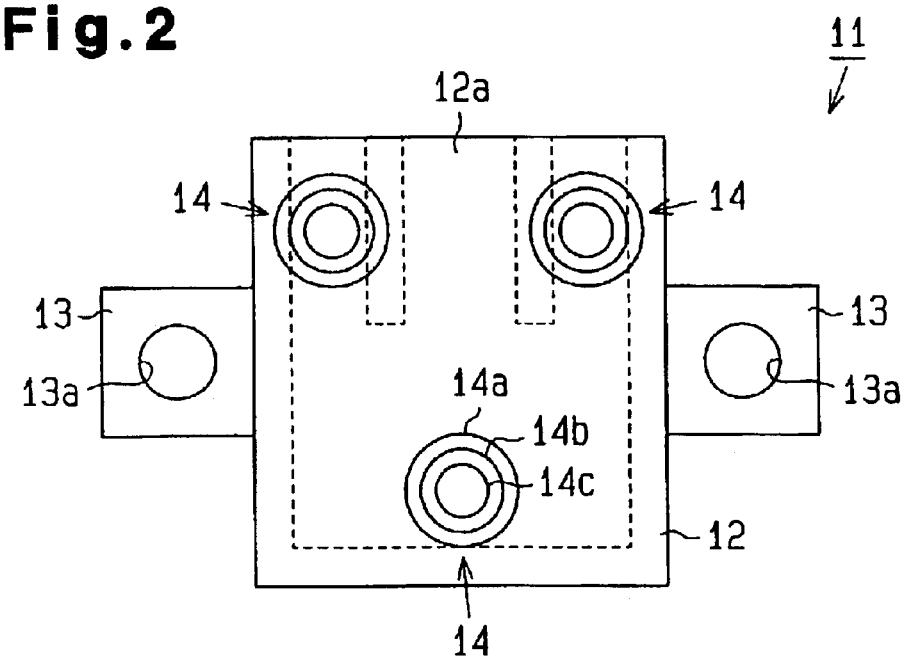
FIG. 2 is a bottom view showing the connector of FIG. 1.

A connector 11 shown in FIGS. 1 and 2 is made of synthetic resin and includes a connector body 12, a pair of brackets 13. The projections are three bases 14 in this embodiment. The directions toward the upper side and the lower side of the connector 11 coincide with the upward direction and the downward direction in FIG. 1. The directions toward the left side and the right side of the connector 11 coincide with the leftward direction and the rightward direction in FIGS. 1 and 2. The directions toward the front side and the rear side of the connector 11 coincide with the upward direction and the downward direction in FIG. 2.

The connector body 12 is shaped like a rectangular box having opening at the front. Connecting electrodes (not shown) are located in the connector body 12. When a male connector is fitted into the connector body 12, the connecting electrodes contact the connecting terminals of the male connector. The lower surface 12a of the connector body 12 serves as a facing side of the connector.

The brackets 13 are located at the left and right sides of the connector body 12 and are integrally formed with the connector body 12. The lower surface of each bracket 13 is flush with a lower surface 12a of the connector body 12. A vertical through hole 13a is formed in each bracket 13. Each through hole 13a has a circular cross-section.

The bases 14 are located at a left front section, a right front section, and a laterally central rear section in the lower surface 12a of the connector body 12. The bases 42 are formed integrally with the connector body 12. The bases 14 have the same shape and the same size.

Each base 14 has a large column portion 14a, a middle column portion 14b, and a small column portion 14c. The column portions 14a to 14c of each base 14 are coaxial and have the same height. The large column portion 14a of each base 14 protrudes from the lower surface 12a of the connector body 12. The middle column portion 14b protrudes from the lower surface of the large column portion 14a. The outer diameter of the middle column portion 14b is smaller than that of the large column portion 14a. The small column portion 14c protrudes from the lower surface of the middle column portion 14b. The outer diameter of the small column portion 14c is smaller than that of the middle column portion 14b. Therefore, the cross-sectional area of each base 14 discretely decreases as the distance from the lower surface 12a of the connector body 12 increases. In other words, the cross-sectional area of each base 14 discretely decreases toward the distal end.

As shown in FIGS. 3 to 6, the connector 11 is fixed to one of first to fourth printed boards 31 to 34 having different thicknesses with fasteners, which are two fixing pins 21. The fixing pins 21 are made of metal or synthetic resin. The coupling pins 21 each have a head 21a, a pair of elastic axial portions 21b extending from the head 21a, and engaging portions at the distal ends of the axial portions 21b. In this embodiment, the engaging portions are stopper claws 21c. The length of the axial portions 21b are the same in any of the fixing pins 21 that are used for fixing the connector 11 to any one of the first to fourth printed boards 31 to 34. That is, the connector 11 is fixed to any one of the first to fourth printed boards 31 to 34 with the common fixing pins 21.

In FIGS. 3 to 6, the base 14 at the rear of the connector 11 is omitted for purposes of illustration.

Figure 3:
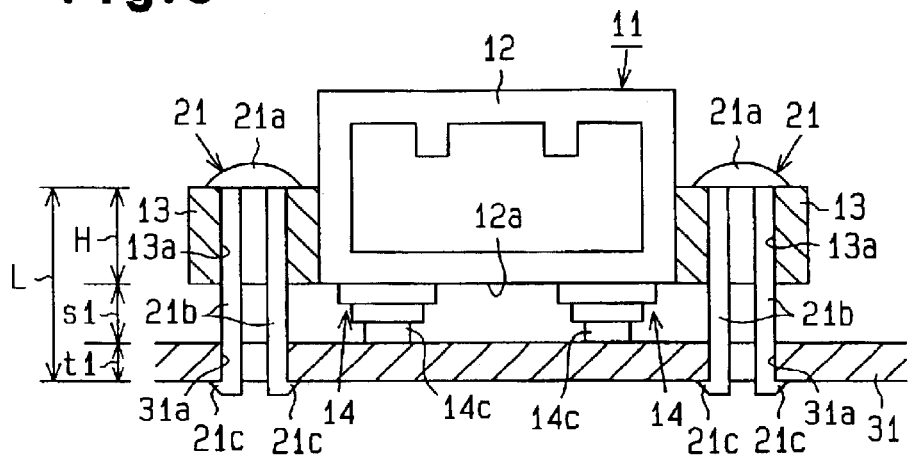
FIG. 3 is a front view, with a part cut away, illustrating the connector shown in FIG. 1 fixed to a first printed board.

The thickness t1 of the first printed board 31 shown in FIG. 3 satisfies the following equation (1). In the equation (1), L represents the length of the axial portions 21b, S1 represents the height of the base 14, and H represents the height of the brackets 13.

$$t1 = L - (S1 + H) \tag{1}$$

The first printed board 31 has a pair of through holes 31a. Each through hole 31a has a circular cross section and extends vertically through the first printed board 31. The through holes 31a are located at positions that face the through holes 13a of the connector 11 when the connector 11 is fixed to the first printed board 31. The surface (upper side) of the first printed board 31 serves as a facing side of the board.

When the connector 11 is fixed to the first printed board 31, the connector 11 is first placed on the first printed board 31 such that the lower surface of the bases 14, or the lower surfaces of the small column portions 14c, contact the surface of the first printed board 31. Then, the fixing pins 21 are inserted into the through holes 13a of the connector 11 and the through holes 31a of the first printed board 31 from above. The head 21a of each inserted pin 21 engages with a part of the top surface of the corresponding bracket 13 about the through hole 13a. The stopper claws 21c of each pin 21 are engaged with a part of the bottom surface of the first printed board 31 about the corresponding through hole 31a. This fixes the connector 11 to the first printed board 31 and prevents the connector 11 from being loosely held in a direction perpendicular to the first printed board 31.

When the connector 11 is fixed to the first printed board 31, the bases 14 function as a distance maintaining mechanism. The bases 14 determine the position of the connector 11 relative to the first printed board 31 such that the distance between the lower surface 12a of the connector body 12 and the upper surface of the first printed board 31 is maintained equal to the height S1 of the bases 14.

Figure 4:
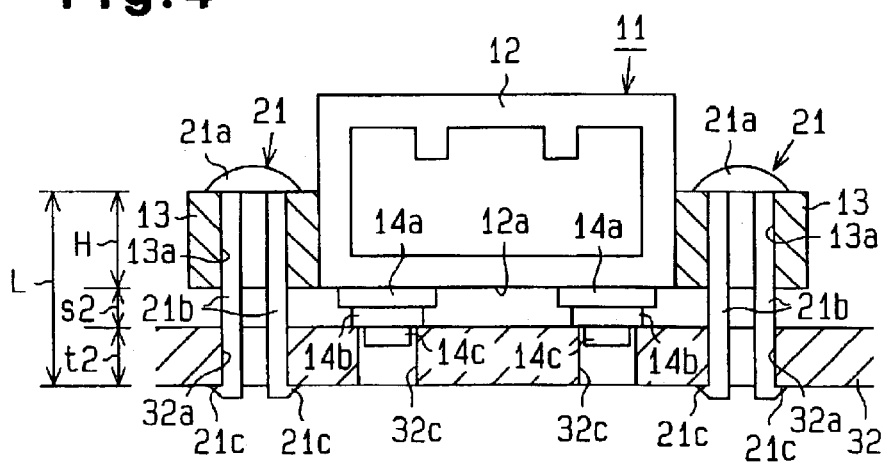
FIG. 4 is a front view, with a part cut away, illustrating the connector shown in FIG. 1 fixed to a second printed board.

The thickness t2 of a second printed board 32 shown in FIG. 4 satisfies the following equation (2) and is greater than the thickness t1 of the first printed board 31. In the equation (2), S2 represents the sum of the height of the large column portion 14a and the height of the middle column portion 14b.

$$t2 = L - (S2 + H) \tag{2}$$

The second printed board 32 has a pair of through holes 32a and three receiving holes 32c. Each of the through holes 32a and the receiving holes 32c has a circular cross section and extends vertically through the second printed board 32. The through holes 32a are located at positions that face the through holes 13a of the connector 11 when the connector 11 is fixed to the second printed board 32. The receiving holes 32c are located at positions that face the bases 14 of the connector 11 when the connector 11 is fixed to the second printed board 32. The inner diameter of the receiving holes 32c is smaller than the outer diameter of the middle column portions 14b and greater than the outer diameter of the small column portions 14c. The surface (upper side) of the second printed board 32 serves as a facing side of the board.

When the connector 11 is fixed to the second printed board 32, the connector 11 is placed on the second printed board 32 such that the distal ends of the bases 14 enter the receiving holes 32c. Then, the step between each middle column portion 14b and the associated small column portion 14c, or the lower surface of the middle column portion 14b, contacts a part of the surface of the second printed board 32 about the corresponding receiving hole 32c. Subsequently, the fixing pins 21 are inserted into the through holes 13a of the connector 11 and the through holes 32a of the second printed board 32 from above. The head 21a of each inserted pin 21 engages with a part of the top surface of the corresponding bracket 13 about the through hole 13a. The stopper claws 21c of each pin 21 are engaged with a part of the bottom surface of the second printed board 32 about the corresponding through hole 32a. This fixes the connector 11 to the second printed board 32 and prevents the connector 11 from being loosely held in a direction perpendicular to the second printed board 32.

When the connector 11 is fixed to the second printed board 32, the bases 14 and the receiving holes 32c function as a distance maintaining mechanism. The bases 14 and the receiving holes 32c determine the position of the connector 11 relative to the second printed board 32 such that the distance between the lower surface 12a of the connector body 12 and the upper surface of the second printed board 32 is maintained equal to the sum S2 of the large column portions 14a and the height of the middle column portions 14b.

Figure 5:
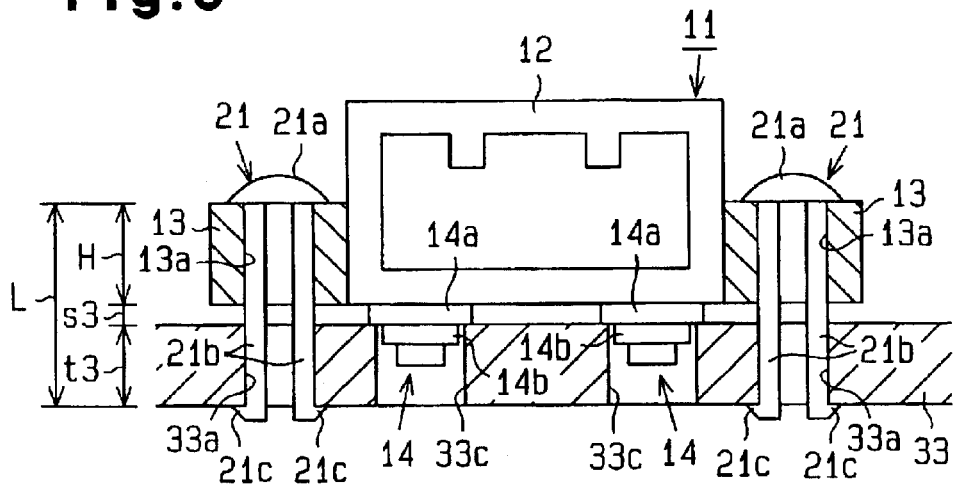
FIG. 5 is a front view, with a part cut away, illustrating the connector shown in FIG. 1 fixed to a third printed board.

The thickness t3 of a third printed board 33 shown in FIG. 5 satisfies the following equation (3) and is greater than the thickness t2 of the second printed board 32. In the equation (3), S3 represents the height of the large column portion 14a.

$$t3 = L - (S3 + H) \quad (3)$$

The third printed board 33 has a pair of through holes 33a and three receiving holes 33c. Each of the through holes 33a and the receiving holes 33c has a circular cross section and extends vertically through the third printed board 33. The through holes 33a are located at positions that face the through holes 13a of the connector 11 when the connector 11 is fixed to the third printed board 33. The receiving holes 33c are located at positions that face the bases 14 of the connector 11 when the connector 11 is fixed to the third printed board 33. The inner diameter of the receiving holes 33c is smaller than the outer diameter of the large column portions 14a and greater than the outer diameter of the middle column portions 14b. The surface (upper side) of the third printed board 33 serves as a facing side of the board.

When the connector 11 is fixed to the third printed board 33, the connector 11 is placed on the third printed board 33 such that the distal ends of the bases 14 enter the receiving holes 33c. Then, the step between each large column portion 14a and the associated middle column portion 14b, or the lower surface of the large column portion 14a, contacts a part of the surface of the third printed board 33 about the corresponding receiving hole 33c. Subsequently, the fixing pins 21 are inserted into the through holes 13a of the connector 11 and the through holes 33a of the third printed board 33 from above. The head 21a of each inserted pin 21 engages with a part of the top surface of the corresponding bracket 13 about the through hole 13a. The stopper claws 21c of each pin 21 are engaged with a part of the bottom surface of the third printed board 33 about the corresponding through hole 33a. This fixes the connector 11 to the third printed board 33 and prevents the connector 11 from being loosely held in a direction perpendicular to the third printed board 33.

When the connector 11 is fixed to the third printed board 33, the bases 14 and the receiving holes 33c function as a distance maintaining mechanism. The bases 14 and the receiving holes 33c determine the position of the connector 11 relative to the third printed board 33 such that the distance between the lower surface 12a of the connector body 12 and the upper surface of the third printed board 33 is maintained equal to the height S3 of the large column portions 14a.

Figure 6:
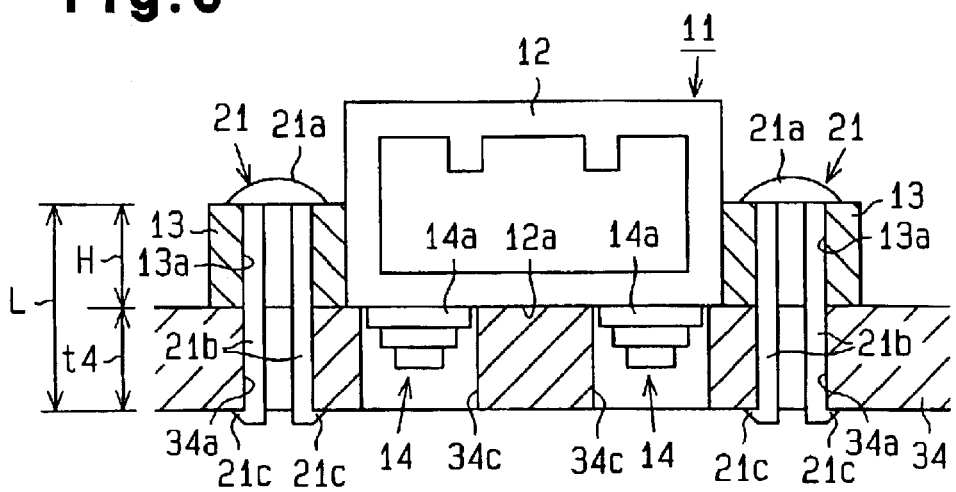
FIG. 6 is a front view, with a part cut away, illustrating the connector shown in FIG. 1 fixed to a fourth printed board.

The thickness t4 of a fourth printed board 34 shown in FIG. 6 satisfies the following equation (4) and is greater than the thickness t3 of the third printed board 33.

$$t7 = L - (L - H) \quad (4)$$

The fourth printed board 34 has a pair of through holes 34a and three receiving holes 34c. Each of the through holes 34a and the receiving holes 34c has a circular cross-section and extends vertically through the fourth printed board 34. The through holes 34a are located at positions that face the through holes 13a of the connector 11 when the connector 11 is fixed to the fourth printed board 34. The receiving holes 34c are located at positions that face the bases 14 of the connector 11 when the connector 11 is fixed to the fourth printed board 34. The inner diameter of the receiving holes 34c is greater than the outer diameter of the large column portions 14a. The surface (upper side) of the fourth printed board 34 serves as a facing side of the board When the connector 11 is fixed to the fourth printed board 34, the connector 11 is placed on the fourth printed board 34 such that the distal ends of the bases 14 enter the receiving holes 34c. Then, the lower surface 12a of the connector body 12 and the lower surface of the brackets 13 contacts the upper surface of the fourth printed board 34. Subsequently, the fixing pins 21 are inserted into the through holes 13a of the connector 11 and the through holes 34a of the fourth printed board 34 from above. The head 21a of each inserted pin 21 engages with a part of the top surface of the corresponding bracket 13 about the through hole 13a. The stopper claws 21c of each pin 21 are engaged with a part of the bottom surface of the fourth printed board 34 about the corresponding through hole 34a. This fixes the connector 11 to the fourth printed board 34 and prevents the connector 11 from being loosely held in a direction perpendicular to the fourth printed board 34.

When the connector 11 is fixed to the fourth printed board 34, the bases 14 and the receiving holes 34c function as a distance maintaining mechanism. The bases 14 and the receiving holes 34c determine the position of the connector 11 relative to the fourth printed board 34 such that the distance between the lower surface 12a of the connector body 12 and the upper surface of the fourth printed board 34 is maintained equal to zero.

The first embodiment has the following advantages.

The connector 11 is fixed to any one of the first to fourth printed boards 31 to 34 with the common fixing pins 21. Using the common fixing pins 21 reduces the costs.

The cross-sectional area of each base 14 discretely decreases away from the lower surface of the connector body 12. Therefore, even if errors are created in the inner diameter of the receiving holes 32c of the second printed board 32 when the receiving holes 32c are machined, the connector 11 is fixed to the second printed board 32 without being influenced by the machining errors as long as the inner diameter of the receiving holes 32c is smaller than the outer diameter of the middle column portions 14b and is greater than the outer diameter of the small column portions 14c. Also, even if errors are created in the inner diameter of the receiving holes 33c of the third printed board 33 when the receiving holes 33c are machined, the connector 11 is fixed to the third printed board 33 without being influenced by the machining errors as long as the inner diameter of the receiving holes 33c is smaller than the outer diameter of the large column portions 14a and is greater than the outer diameter of the middle column portions 14b.

If the number of the bases 14 of the connector 11 is one or two, the connector 11 will be unstable when placed on any of the first to fourth printed boards 31 to 34. If the number of the bases 14 of the connector 11 is four or more, the connector 11 will be stable on any of the first to fourth printed boards 31 to 34. However, the increased number of the bases 14 increases the cost of material. In contrast, the connector 11 shown in FIGS. 1 and 2 has the three bases 14. Therefore the connector 11 is stably placed on any of the first to fourth printed boards 31 to 34 and does not significantly increases the material cost.

A second embodiment of the present invention will now be described with reference to FIGS. 7 to 9. The differences from the first embodiment will mainly be discussed.

Figure 7:
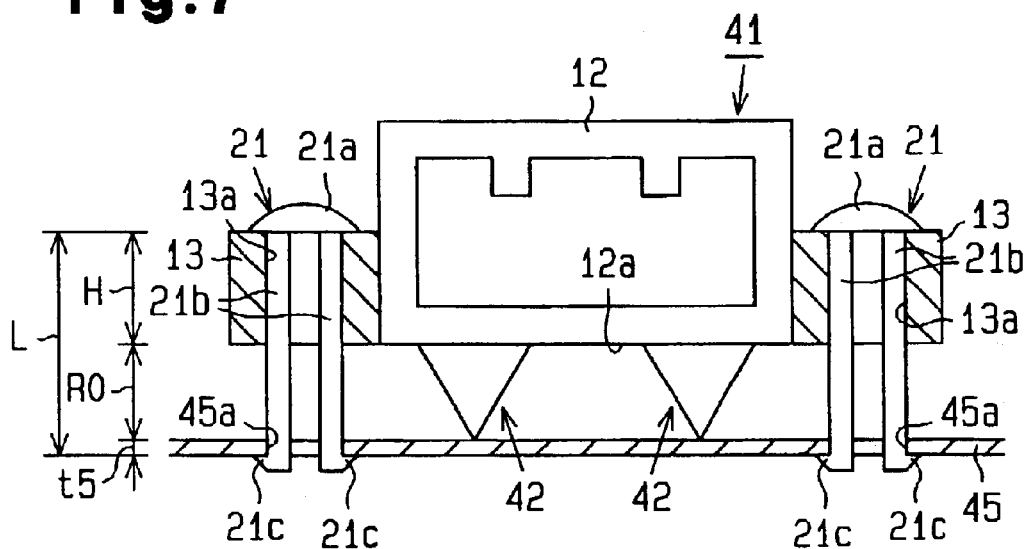
FIG. 7 is a front view, with a part cut away, illustrating a connector according to a second embodiment fixed to a fifth printed board.
Figure 8:
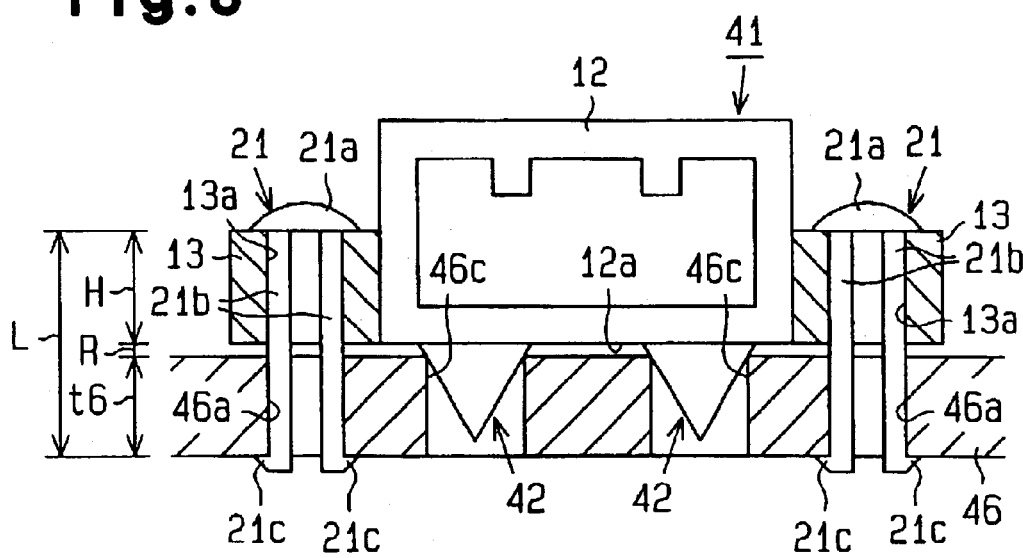
FIG. 8 is a front view, with a part cut away, illustrating the connector according to the second embodiment fixed to a sixth printed board.
Figure 9:
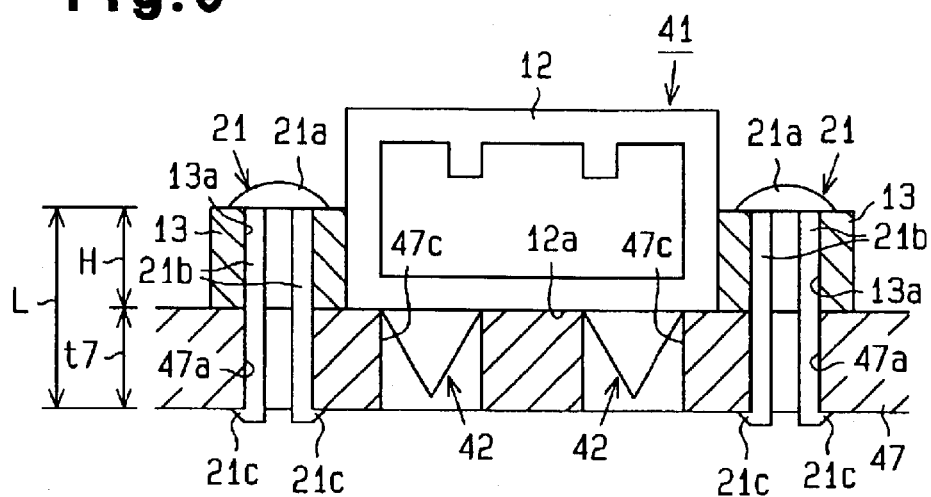
FIG. 9 is a front view, with a part cut away, illustrating the connector according to the second embodiment fixed to a seventh printed board.

A connector 41 shown in FIGS. 7 to 9 is different from the connector 11 shown in FIGS. 1 and 2 in that the bases 14 are replaced by bases 42, which are shaped like inverted cones. The bases 42 are located at a left front section, a right front section, and a laterally central rear section in the lower surface 12a of the connector body 12. The bases 42 are formed integrally with the connector body 12. In FIGS. 7 to 9, the base 42 at the rear of the connector 41 is omitted for purposes of illustration. The bases 42 have the same shape and the same size. The cross-sectional area of each base 42 linearly decreases away from the lower surface 12a of the connector body 12.

As shown in FIGS. 7 to 9, the connector 41 is fixed to one of fifth to seventh printed boards 45 to 47 having different thicknesses with the two fixing pins 21. The length of the axial portions 21b are the same in any of the fixing pins 21 that are used for fixing the connector 41 to any one of the fifth to seventh printed boards 45 to 47. That is, the connector 41 is fixed to any one of the fifth to seventh printed boards 45 to 47 with the common fixing pins 21.

The thickness t5 of the fifth printed board 45 shown in FIG. 7 satisfies the following equation (5). In the equation (5), R0 represents the height of the bases 42.

$$t5=L-(R0+H) \quad (5)$$

The fifth printed board 45 has a pair of through holes 45a. Each through hole 45a has a circular cross section and extends vertically through the fifth printed board 45. The through holes 45a are located at positions that face the through holes 13a of the connector 41 when the connector 41 is fixed to the fifth printed board 45. The surface (upper side) of the fifth printed board 45 serves as a facing side of the board.

When the connector 41 is fixed to the fifth printed board 45, the connector 41 is first placed on the fifth printed board 45 such that the distal ends (the apexes of the cones) of the bases 42 contact the surface of the fifth printed board 45. Subsequently, the fixing pins 21 are inserted into the through holes 13a of the connector 41 and the through holes 45a of the fifth printed board 45 from above. The head 21a of each inserted pin 21 engages with a part of the top surface of the corresponding bracket 13 about the through hole 13a. The stopper claws 21c of each pin 21 are engaged with a part of the bottom surface of the fifth printed board 45 about the corresponding through hole 45a. This fixes the connector 41 to the fifth printed board 45 and prevents the connector 41 from being loosely held in a direction perpendicular to the fifth printed board 45.

When the connector 41 is fixed to the fifth printed board 45, the bases 42 function as a distance maintaining mechanism. The bases 42 determine the position of the connector 41 relative to the fifth printed board 45 such that the distance between the lower surface 12a of the connector body 12 and the upper surface of the fifth printed board 45 is maintained equal to the height R0 of the bases 42.

The thickness t6 of a sixth printed board 46 shown in FIG. 8 satisfies the following equation (6) and is greater than the thickness t5 of the fifth printed board 45. In the equation (6), R represents a predetermined value that is greater than zero and less than the height R0 of the bases 42.

$$t6=L-(R+H) \quad (6)$$

The sixth printed board 46 has a pair of through holes 46a and three receiving holes 46c. Each of the through holes 46a and the receiving holes 46c has a circular cross section and extends vertically through the sixth printed board 46. The through holes 46a are located at positions that face the through holes 13a of the connector 41 when the connector 41 is fixed to the sixth printed board 46. The receiving holes 46c are located at positions that face the bases 42 of the connector 41 when the connector 41 is fixed to the sixth printed board 46. The inner diameter of each receiving hole 46c is equal to the outer diameter of a part of each base 42 that is spaced from the lower surface 12a of the connector body 12 by the predetermined value R. The surface (upper side) of the sixth printed board 46 serves as a facing side of the board.

When the connector 41 is fixed to the sixth printed board 46, the connector 41 is placed on the sixth printed board 46 such that the distal ends of the bases 42 enter the receiving holes 46c. Then, the side of each base 42 (cone surface) contacts a part of the surface of the sixth printed board 46 about the corresponding receiving hole 46c. Subsequently, the fixing pins 21 are inserted into the through holes 13a of the connector 41 and the through holes 46a of the sixth printed board 46 from above. The head 21a of each inserted pin 21 engages with a part of the top surface of the corresponding bracket 13 about the through hole 13a. The stopper claws 21c of each pin 21 are engaged with a part of the bottom surface of the sixth printed board 46 about the corresponding through hole 46a. This fixes the connector 41 to the sixth printed board 46 and prevents the connector 41 from being loosely held in a direction perpendicular to the sixth printed board 46.

When the connector 41 is fixed to the sixth printed board 46, the bases 42 and the receiving holes 46c function as a distance maintaining mechanism. The bases 42 and the receiving holes 46c determine the position of the connector 41 relative to the sixth printed board 46 such that the distance between the lower surface 12a of the connector body 12 and the upper surface of the sixth printed board 46 is maintained equal to the predetermined value R.

The thickness t7 of a seventh printed board 47 shown in FIG. 9 satisfies the following equation (7) and is greater than the thickness t6 of the sixth printed board 46.

$$t7=L-(L-H) \quad (7)$$

The seventh printed board 47 has a pair of through holes 47a and three receiving holes 47c. Each of the through holes 47a and the receiving holes 47c has a circular cross section and extends vertically through the seventh printed board 47. The through holes 47a are located at positions that face the through holes 13a of the connector 41 when the connector 41 is fixed to the seventh printed board 47. The receiving holes 47c are located at positions that face the bases 42 of the connector 41 when the connector 41 is fixed to the seventh printed board 47. The inner diameter of the receiving holes 47c is greater than the outer diameter of the proximal end of the bases 42. The surface (upper side) of the seventh printed board 47 serves as a facing side of the board.

When the connector 41 is fixed to the seventh printed board 47, the connector 41 is placed on the seventh printed board 47 such that the distal ends of the bases 42 enter the receiving holes 47c. Then, the lower surface 12a of the connector body 12 and the lower surface of the brackets 13 contacts the upper surface of the seventh printed board 47. Subsequently, the fixing pins 21 are inserted into the through holes 13a of the connector 41 and the through holes 47a of the seventh printed board 47 from above. The head 21a of each inserted pin 21 engages with a part of the top surface of the corresponding bracket 13 about the through hole 13a. The stopper claws 21c of each pin 21 are engaged with a part of the bottom surface of the seventh printed board 47 about corresponding the through hole 47a. This fixes the connector 41 to the seventh printed board 47 and prevents the connector 41 from being loosely held in a direction perpendicular to the seventh printed board 47.

When the connector 41 is fixed to the seventh printed board 47, the bases 42 and the receiving holes 47c function as a distance maintaining mechanism. The bases 42 and the receiving holes 47c determine the position of the connector 41 relative to the seventh printed board 47 such that the distance between the lower surface 12a of the connector body 12 and the upper surface of the seventh printed board 47 is maintained equal to zero.

The second embodiment has the following advantages.

The connector 41 is fixed to any one of the fifth to seventh printed boards 45 to 47 with the common fixing pins 21. Using the common fixing pins 21 reduces the costs.

If the number of the bases 42 of the connector 41 is one or two, the connector 41 will be unstable when placed on any of the fifth to seventh printed boards 45 to 47. If the number of the bases 42 of the connector 41 is four or more, the connector 41 will be stable on any of the fifth to seventh printed boards 45 to 47. However, the increased number of the bases 42 increases the cost of material. In contrast, the connector 41 shown in FIGS. 7 and 9 has the three bases 42. Therefore the connector 41 is stably placed on any of the fifth to seventh printed boards 45 to 47 and does not significantly increase the material cost.

The first and second embodiments may be modified as follows.

FIG. 10A shows a connector 51 according to another embodiment. The connector 51 has no through holes 13a in the brackets 13 but has a pair of axial portions 52 extending downward from the lower surfaces of the brackets 13. An engaging portion, which is an stopper claw 52a, is formed in the distal end of each axial portion 52. When the connector 51 is fixed to, for example, the first printed board 31, the axial portions 52 are inserted into the through holes 31a of the first printed board 31. The stopper claws 52a of the inserted axial portions 52 engage with parts of the back surface of the first printed board 31 about the through holes 31a.

FIG. 10B shows another embodiment, in which the fixing pins 21 are inserted into the through holes 13a of the connector 11 and the through holes 31a of the first printed board 31 from below. In this case, the head 21a of each inserted pin 21 engages with a part of the bottom surface of the first printed board 31 about the corresponding through hole 31a. The stopper claws 21c of each pin 21 are engaged with a part of the top surface of the corresponding bracket 13 about the through hole 13a.

The fixing pins 21 may be inserted into the through holes 13a of the connector 41 and the through holes 45a to 47a of the fifth to seventh printed boards 45 to 47 from below.

FIG. 10C shows a connector 61 according to another embodiment. The connector 61 is the same as the connector 41 shown in FIGS. 7 to 9 except that the bases 42 are replaced with bases 62 shaped like inverted trumpets. The cross-sectional area of each base 62 continuously and non-linearly decreases away from the lower surface of the connector body 12.

The fixing pins 21 may be inserted into the through holes 13a of the connector 61 shown in FIG. 10C and the through holes 46a of the sixth printed board 46 from below.

FIG. 10D shows a connector 65 according to another embodiment. The connector 65 has no brackets 13 but has one or more axial portions 52 extending from the lower surface 12a of the connector body 12. An engaging portion, which is an stopper claw 52a, is formed in the distal end of each axial portion 52. When the connector 65 is fixed to, for example, the first printed board 31, the axial portions 52 are inserted into through holes 31d formed in the first printed board 31. The stopper claws 52a of the inserted axial portions 52 engage with parts of the back surface of the first printed board 31 about the through holes 31d.

Figure 11:
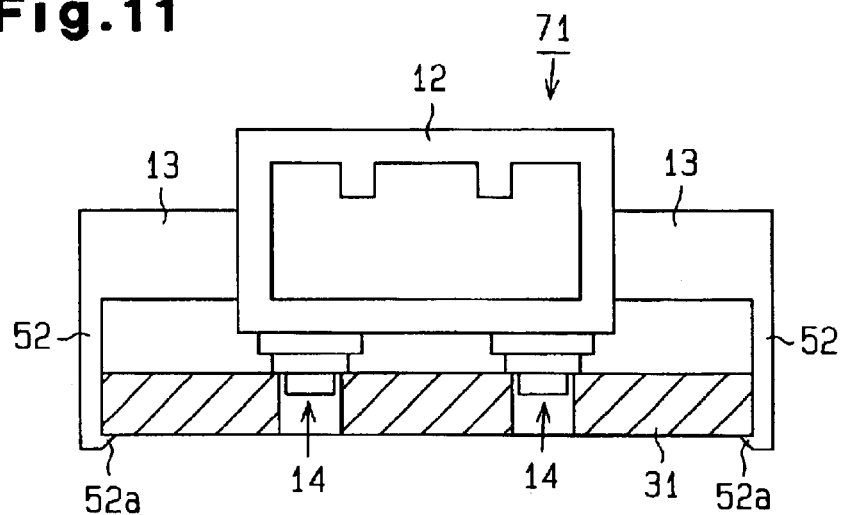
FIG. 11 is a front view, with a part cut away, illustrating a connector according to another embodiment fixed to the first printed board.

FIG. 11 shows a connector 71 according to another embodiment. The connector 71 has no through holes 13a in the brackets 13 but has axial portions 52 extending downward from the lower surfaces of the brackets 13. An engaging portion, which is a stopper claw 52a, is formed in the distal end of each axial portion 52. When the connector 71 is fixed to, for example, the first printed board 31, the claws 52a are engaged with peripheral portions of the back surface of the first printed board 31.

Figure 12:
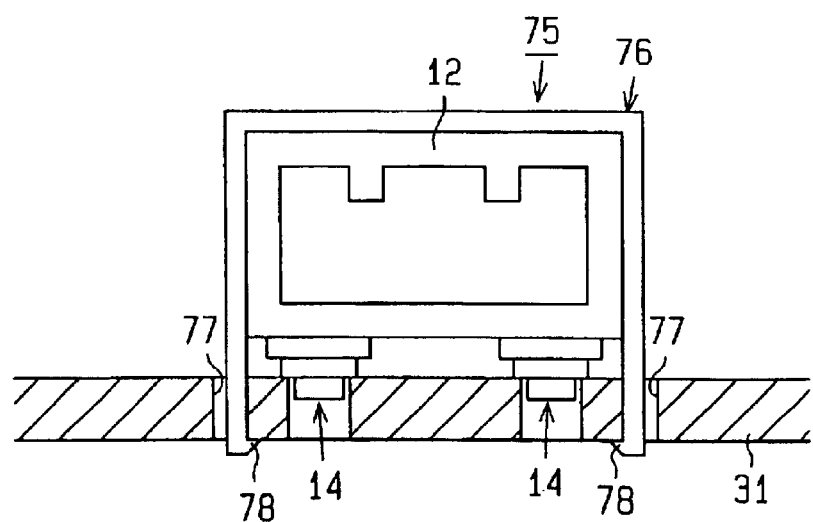
FIG. 12 is a front view, with a part cut away, illustrating a connector according to another embodiment fixed to the first printed board.
Figure 13:
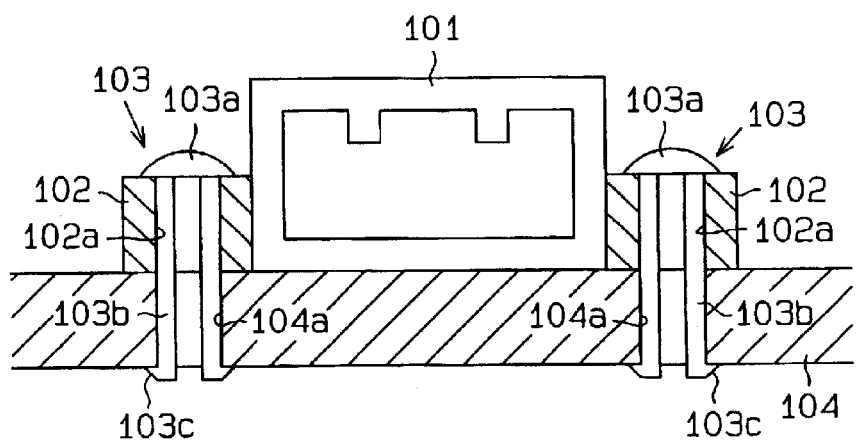
FIG. 13 is a front view, with a part cut away, illustrating a prior art connector fixed to a printed board.

As in a connector 75 shown in FIG. 12, the brackets 13 may be omitted. When the connector 75 is fixed to, for example, the first printed board 31, a fastener, which is an inverted U-shaped engaging member 76, is used instead of the fixing pins 21. The engaging member 76 is attached to the connector 75 in a straddling manner. The engaging member 76 has a pair of end portions 78. The end portions 78 are inserted into through holes 77 formed in the first printed board 31. The inserted end portions 78 engage with parts of the back surface of the first printed board 31 about the through holes 77. The end portions 78 of the engaging member 76 function as engaging portions.

The through holes 13a may be omitted from the connector 41 shown in FIGS. 7 to 9, and a pair of axial portions 52 extending downward may be formed on the lower surfaces of the brackets 13.

The through holes 13a may be omitted from the connector 61 shown in FIG. 10C, and a pair of axial portions 52 extending downward may be formed on the lower surfaces of the brackets 13.

The number of the bases 14, 42, 62 of in each of the connectors 11, 41, 61 may be one, two, four or more.

The heights of the column portions 14a to 14c of each base 14 may be different.

The bases 14 of the connector 11 may be replaced with bases each having coaxial prisms.

The base 42 may be formed like inverted and truncated cones, inverted pyramids, or inverted and truncated pyramids.

The number of the column portions 14a to 14c of each base 14 may be one, two, four or more.

The cross-section of each receiving hole 32c need not be circular, but may be a polygon, such as a square.

Therefore, the present examples and embodiments are to be considered as illustrative and not restrictive and the invention is not to be limited to the details given herein, but may be modified within the scope and equivalence of the appended claims.

What is claimed is:

1. A fixing structure of a connector having a facing side and a board having a facing side, comprising:

a fastener for fixing the connector to the board, wherein the fastener extends from the connector toward the board, wherein the fastener includes an engaging portion for engagement with the board, wherein, the facing sides face each other and define a predetermined space between the facing side of the connector and the facing side of the board, and wherein the predetermined space is varied in accordance with the thickness of the board; and a space maintaining mechanism located between the connector and the board, wherein the space maintaining mechanism determines the position of the connector relative to the board such that the space in accordance with the thickness of the board is maintained, the space maintaining mechanism comprising a board portion including a hole in the facing side of the board and the facing side of the board proximate the hole, a connector portion including a projection projecting from the facing side of the connector, the projection including a first circumference and a plurality of circumferences further from the facing side of the connector than the first circumference, wherein the magnitude of each of the plurality of circumference is less than that of each of the circumferences closer to the board, wherein the connector portion is sized and positioned to engage with the board portion when the engaging portion is engaged with the board, wherein the fastener is separately formed from the space maintaining mechanism, and the length of a portion of the fastener from the facing side of the connector to the engaging portion is constant regardless of the thickness of the board.

2. The fixing structure according to claim 1, wherein the projection is one of at least three projections.

3. The fixing structure according to claim 1, wherein the fastener is formed on the connector and extends toward the board.

4. The fixing structure according to claim 1, where the hole is a first hole, and the board has a second hole, wherein the fastener is inserted in to the second hole to engage the engaging portion with the board.

5. The fixing structure according to claim 1, wherein the hole has an area greater than zero.

6. The fixing structure according to claim 1, wherein the space in accordance with the thickness of the board is decreased as the thickness of the board increases.

7. The fixing structure according to claim 6, wherein the sum of the space in accordance with the thickness of the board and the thickness of the board is constant regardless of the thickness of the board.

8. The fixing structure according to claim 1, wherein the cross-sectional area of the projection decreases as the distance from the facing side of the connector increases, and wherein the cross-sectional area of the hole is larger for the board having a greater thickness.

9. The fixing structure according to claim 8, wherein only a part of the projection that has a smaller cross-sectional area than the cross-sectional area of the hole is inserted into the hole, thereby the space in accordance with the thickness of the board is maintained.

10. The fixing structure according to claim 8, wherein the cross-sectional area of the projection discretely decreases as the distance from the facing side of the connector increases.

11. The fixing structure according to claim 10, wherein the projection includes at least two portions having different cross-sectional areas, and a step defined between the two portions, the step being selectively contacting facing side of the board.

12. The fixing structure according to claim 8, wherein the cross-sectional area of the projection linearly decreases as the distance from the facing side of the connector increases.

* * * * *